US007179676B2

(12) United States Patent
Sollner et al.

(10) Patent No.: US 7,179,676 B2
(45) Date of Patent: Feb. 20, 2007

(54) MANUFACTURING CCDS IN A CONVENTIONAL CMOS PROCESS

(75) Inventors: Gerhard Sollner, Winchester, MA (US); Lawrence J. Kushner, Andover, MA (US); Michael P. Anthony, Andover, MA (US); Edward Kohler, Waltham, MA (US); Wesley Grant, Winsted, CT (US)

(73) Assignee: Kenet, Inc., Woburn, MA (US)

( * ) Notice: Subject to any disclaimer, the term of this patent is extended or adjusted under 35 U.S.C. 154(b) by 143 days.

(21) Appl. No.: 11/091,722

(22) Filed: Mar. 28, 2005

(65) Prior Publication Data

US 2006/0216871 A1    Sep. 28, 2006

(51) Int. Cl.
  *H01L 21/00*  (2006.01)
  *H01L 21/339* (2006.01)

(52) U.S. Cl. .................. 438/75; 438/144; 438/148; 257/E21.617

(58) Field of Classification Search ............ 438/75, 438/144, 148
See application file for complete search history.

(56) References Cited

U.S. PATENT DOCUMENTS

| 3,865,652 | A | * | 2/1975 | Agusta et al. | ............ | 438/144 |
| 4,900,688 | A | * | 2/1990 | Halvis | ............ | 438/144 |
| 4,906,584 | A | * | 3/1990 | Blouke et al. | ............ | 438/146 |
| 6,417,057 | B1 | * | 7/2002 | Takemura et al. | ............ | 438/308 |

* cited by examiner

*Primary Examiner*—Walter Lindsay, Jr.
*Assistant Examiner*—Elias Ullah
(74) *Attorney, Agent, or Firm*—Hamilton Brook Smith & Reynolds, P.C.

(57) ABSTRACT

A technique for forming Charge-Coupled Devices (CCDs) in a conventional Complementary Metal Oxide Semiconductor (CMOS) process. A number of single-layer polysilicon gates are formed on an as-grown, native doped silicon substrate, with gaps between them. Masking is used to selectively dope the gates while preventing doping of the silicon in the gaps. Masking may likewise be used to selectively silicide the gates while preventing silicide formation in the gaps. Conventional source-drain processing produces input/output diffusions for the CCD.

29 Claims, 7 Drawing Sheets

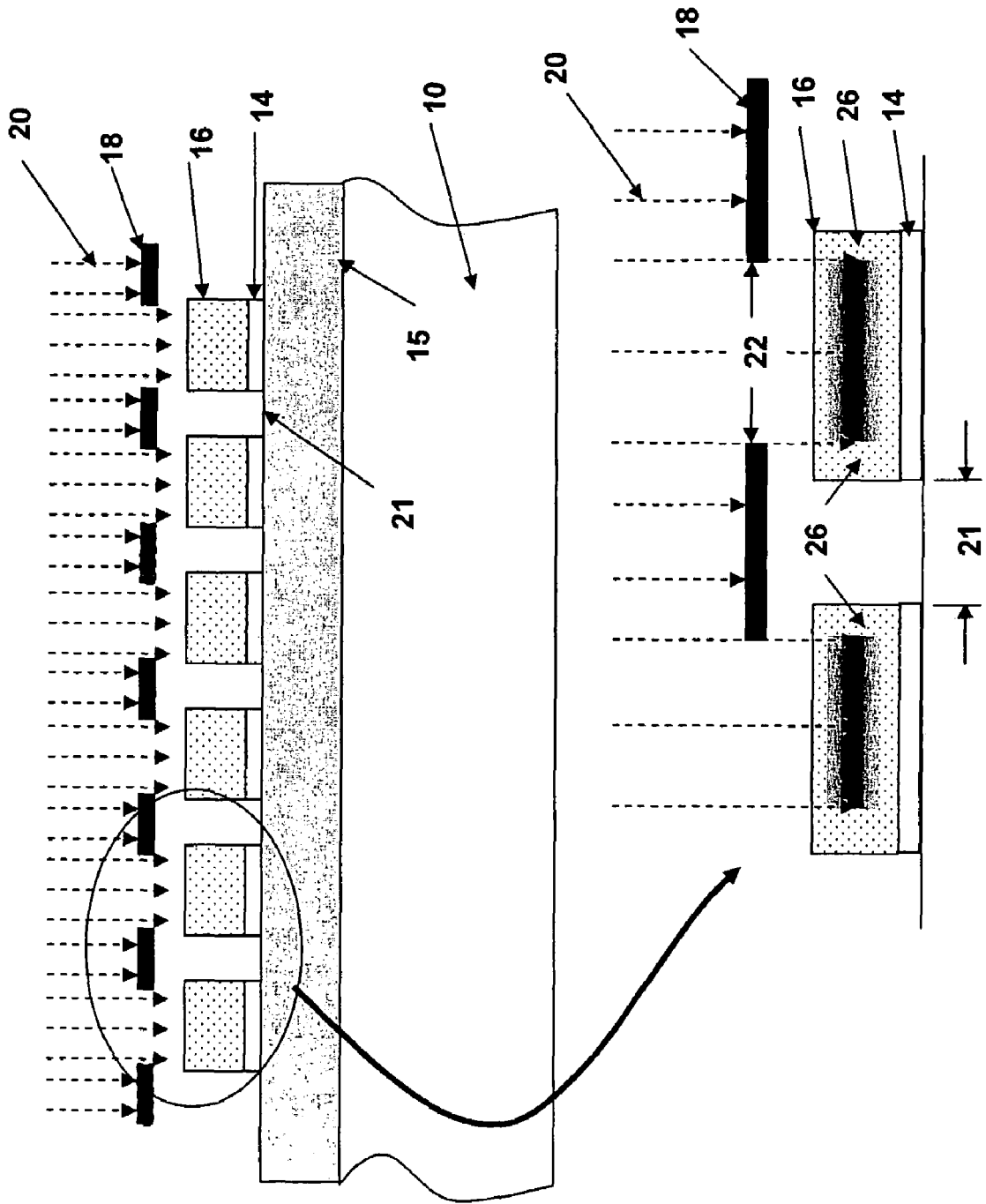

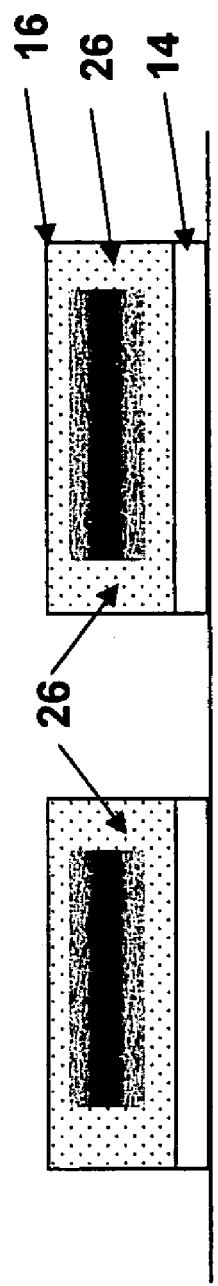
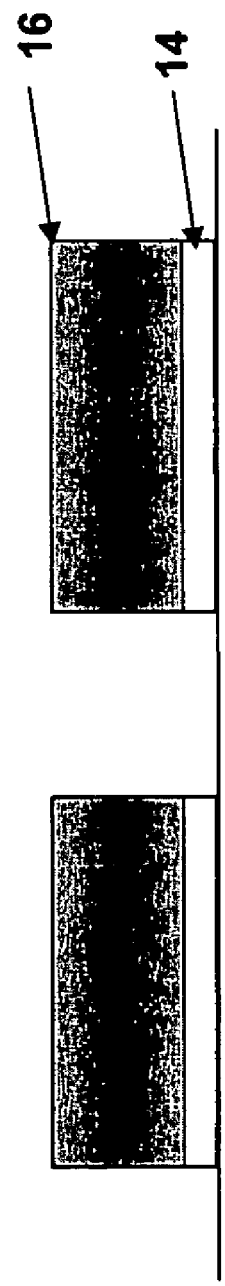

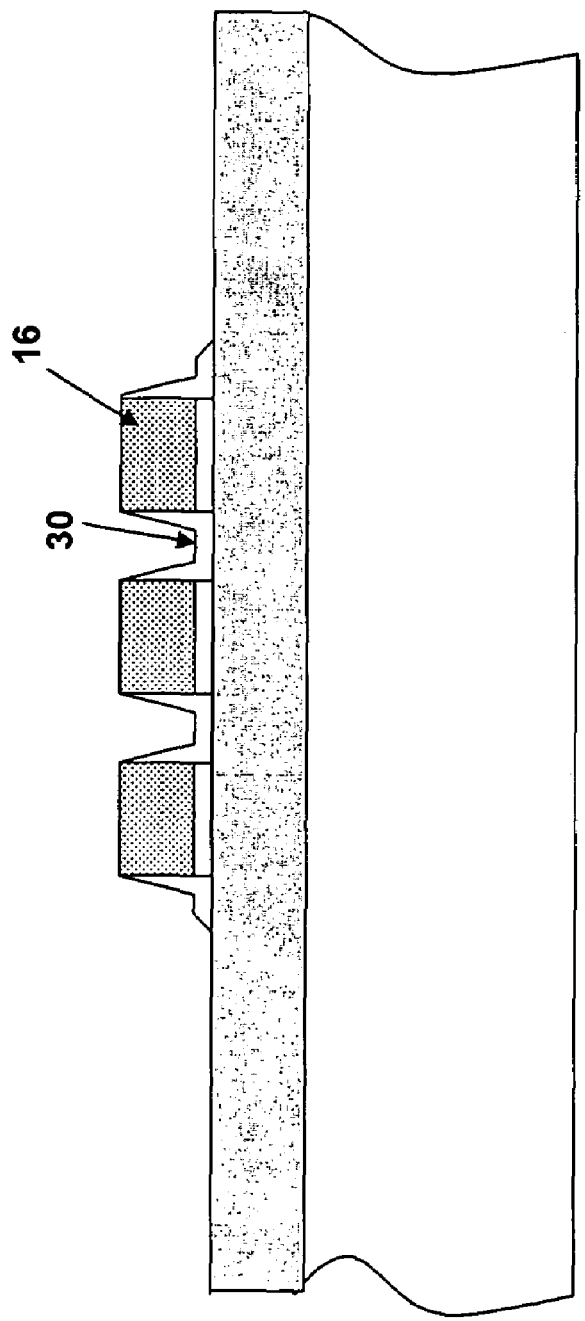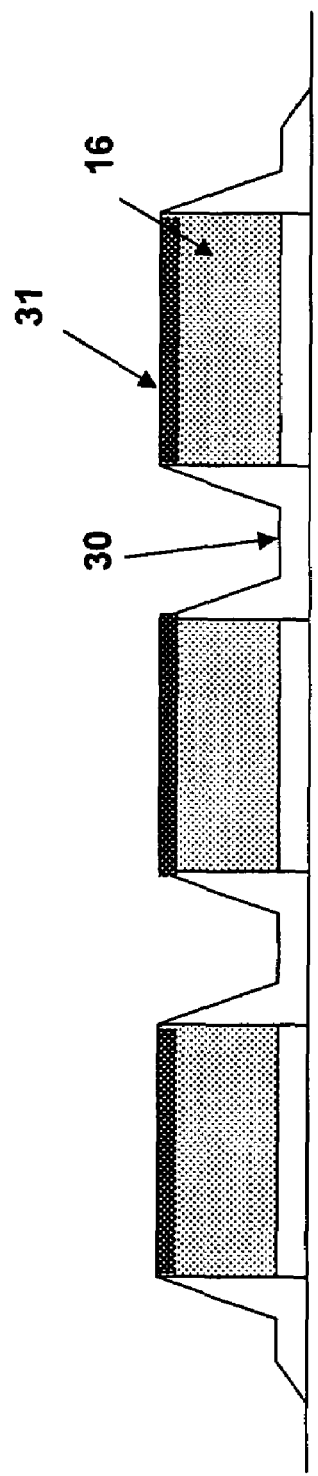

MANUFACTURING CCDS IN A CONVENTIONAL CMOS PROCESS

BACKGROUND OF THE INVENTION

The present invention relates to monolithic solid state devices and in particular to a method of making Charge Coupled Devices (CCDs) using standard Complementary Metal Oxide Semiconductor (CMOS) processes.

CCD devices, as now quite commonly employed as image sensors in digital cameras and the like, consist of an array of elements for moving packets of electronic charge. Each element includes one or more gates fabricated typically by depositing multiple polycrystalline silicon (hereafter referred to as polysilicon) layers over one or more dielectric layers. However, the fabrication processes used for most CCDs are customized to optimize imaging CCDs, and are thus relatively expensive. Also, standard CCD processes do not generally allow fabrication of CMOS circuits.

Emerging CCD fabrication techniques that use only a single polysilicon layer are particularly attractive. As will be taught here, these approaches can be made compatible with standard Complementary Metal Oxide Semiconductor (CMOS) manufacturing technologies, making the integration of CCDs and CMOS circuits on the same chip much easier. The advantages of fabricating a CCD device with only a single polysilicon layer have been previously recognized by others, such as in the article by Okada, Y. "Core Performance of FT-/CCD Image Sensor with Single Layer of Poly-Silicon Electrode", 1999 *IEEE Workshop on Charged Couple Devices and Advance Image Sensors*, Jun. 10–12, 1999. See also U.S. Pat. No. 6,369,413 issued to Hynecek and assigned to Isetex.

SUMMARY OF THE INVENTION

The present invention is a method of fabricating a Charged Coupled Device (CCD) in a conventional Complementary Metal Oxide Semiconductor (CMOS) process originally designed for fabricating digital-logic and analog circuits. The process uses a single layer of polysilicon.

In a preferred arrangement, the CCD is composed of a number of adjacent polysilicon gates in the form of parallel stripes, separated by gaps, over active area on a silicon substrate. In this invention, the silicon active area underneath the gates is chosen to be of the type used under so-called "native" field-effect transistors (FETs) in a conventional CMOS process. The native silicon areas have the same light doping level as the silicon starting material, whether bulk or epitaxial. Some previously-reported methods of manufacturing single-polysilicon CCDs have required buried-channel implants and special implants to dope the silicon substrate in the gaps. By using the native active region instead, high-performance surface-channel CCDs can be fabricated without adding additional doping in the gaps.

In a conventional CMOS fabrication process, a light dopant implant is typically applied to produce what is commonly referred to as "source-drain extension" or "lightly doped drain" regions. This implant is applied in such a way that it is self-aligned with FET gates, and dopes the region of the silicon substrate immediately adjacent to the gates. According to the present invention, a mask is used to block this implant from the CCD area, specifically from the gaps between CCD gates.

FETs are formed in a conventional CMOS process by applying a heavy N or P implant dose, which simultaneously dopes the gate and adjacent source and drain regions of the FET. The gate prevents this implant from reaching the substrate region directly under itself, so a self-aligned source-gate-drain structure is formed. For CCD fabrication in this process it is necessary use a mask to block this implant from the CCD gaps while still allowing it to dope the gates. A small stripe of polysilicon on each side of the gate is also blocked, thus assuring that the implant does not reach the gap even with imperfect mask alignment. During an annealing process that activates the implant, the dopant introduced by the implant then spreads throughout the full extent of the gate area.

This selective masking of the source-drain implant is a unique feature of the present invention. The mask used for this step can be the same mask used to define the N-type or P-type implanted areas generally in the CMOS process. Both N-and P-type gates can be created this way, resulting in a choice of two different gate threshold voltages in the CCD. The two gate types can be intermingled in the same CCD.

In a subsequent step, the metal used to form the metal-silicide on top of the gates to provide lower gate resistivity may also be masked to prevent silicide from forming in the gaps between the gates. The mask used for this purpose can be the one normally used to selectively produce un-silicided polysilicon resistors in the conventional CMOS process. In the case of very small gaps the use of this mask is not necessary, since a spacer region which normally defines the source-drain extension will completely cover the gap, preventing silicide formation there.

One advantage of the present invention is thus provided by the fact that CCDs can be made with CMOS fabrication processes originally intended solely for CMOS circuits. The volume of silicon wafers fabricated with CMOS processes is very large so those processes are well controlled by most vendors and have high yields. That CCDs can be made with such high-volume CMOS processes means that resulting chips will be relatively less expensive than those using a specialized process.

Another advantage is that the CCDs will be faster because their gates can be made more conductive through ion implantation and/or converting part of the gate to a metal silicide.

Additional advantages are provided by the fact that the CMOS logic and analog circuitry can be monolithically incorporated together with the CCDs. In particular, there are many analog and digital operations that can be accomplished more efficiently with CCDs than with digital CMOS processing logic or ordinary analog CMOS circuitry. The availability of CCDs on the same chip with ordinary CMOS circuitry allows a circuit designer the flexibility to use CCDs when they are more efficient and CMOS circuitry when that is more efficient. Moreover, it makes possible the synergistic combination of CMOS and CCD elements, not otherwise possible on the same chip.

A product using the invention can be of advantage in communication and portable consumer product applications such as wireless receivers, transmitters used in wireless local area networks, cellular telephones, as well as for digital cameras both still and video.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 2A and 2B are a cross-sectional and a detailed view used herein to describe process steps used for fabricating a CCD according to the present invention.

FIGS. 3A and 3B are cross-sectional views showing the diffusion of dopant atoms implanted in CCD gates. FIG. 3A shows the concentration of implanted dopant atoms after implantation, FIG. 3B shows how they diffuse in a later step to more uniformly dope the gates.

FIGS. 6A and 6B show a similar result to FIG. 5 with gates formed relatively close to one another followed by formation of metal silicide on the CCD gates.

DETAILED DESCRIPTION OF THE INVENTION

A description of preferred embodiments of the invention follows.

The present invention is a technique for forming high-performance surface-channel Charge-Coupled Devices (CCDs) in a conventional Complementary Metal Oxide Semiconductor (CMOS) process. All masking and processing steps mentioned in the following description are normally available in such a process, and are used conventionally to form Field-Effect Transistors (FETs), resistors, and similar circuit elements. These steps are referred to in the following description without extensive explanation, since they are well-known to those familiar with CMOS integrated-circuit fabrication technology. By applying these steps in certain unique ways, according to the present invention, CCDs can be formed as well. These unique uses of standard processing steps are identified and explained in detail in the following. In this description it is assumed that N-type CCDs are being formed. However, the same procedures, with opposite dopant types, could be used to produce P-type CCDs.

Figure 1:
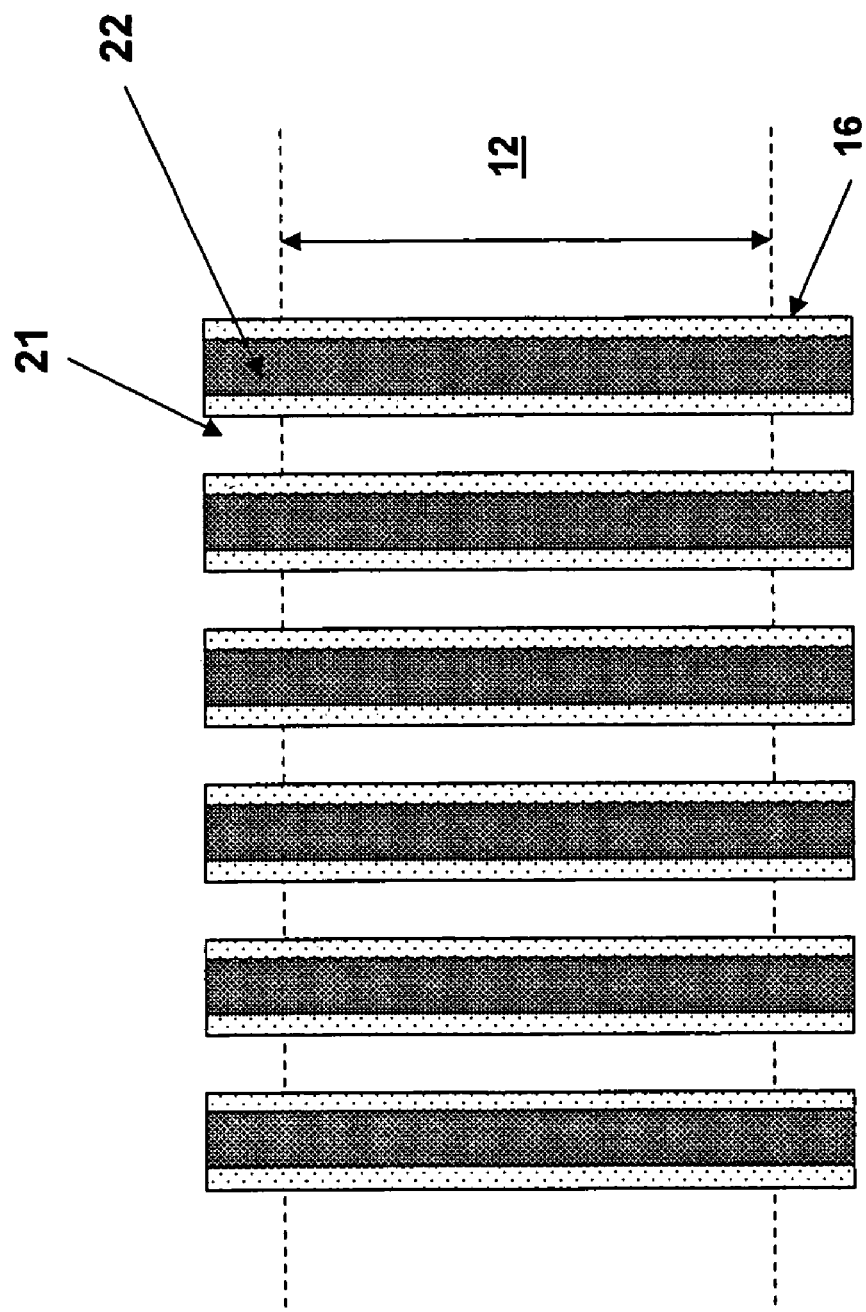
FIG. 1 is a top view of the CCD structures after implantation and/or siliciding of the gates.

FIG. 1 is a plan view showing a basic CCD according to the present invention. It consists of polysilicon gates 16 in the form of parallel stripes over an active area 12. The gates are separated by gaps 21. The active area 12 is of the type used under so-called 'native' FETs in the conventional CMOS process, and thus has a very low doping level. The boundary of the active area (shown as dashed lines in FIG. 1) is defined by an isolation method conventionally used in the process. The polysilicon gates are deposited over a normal gate oxide and patterned using conventional masking and etching methods.

After gates are defined, a "source-drain extension" or "lightly-doped drain" (LDD) implant is conventionally applied. This LDD implant is blocked by the gates, but penetrates the silicon substrate adjacent to the gates, forming part of the source and drain of conventional FETs. In the CCD shown in FIG. 1, this implant would normally penetrate the substrate in the gaps 21. For a functional CCD to be formed, such doping of the gaps 21 must be prevented. A mask is typically available to block the LDD implant in the conventional CMOS process. Its conventional use is to prevent N-type LDD implants in PFETs. One feature of the present invention is the use of this same mask to block the LDD implant from the CCD gaps 21.

FIG. 2A shows a cross-section of the same basic CCD shown in FIG. 1. The gates 16 and gaps 21, together with the underlying gate oxide 14, are visible. The present invention is applicable to both epitaxial and bulk starting material, provided that the upper level of the substrate is lightly doped. FIG. 2A shows the silicon substrate 10 and a possible epitaxial layer 15.

After formation and patterning of gates and the LDD implant, the conventional CMOS process proceeds to the formation of insulating spacers on the sides of the gates (discussed later in conjunction with FIGS. 5 and 6), followed by a heavy implant which forms the FET source and drain and dopes the FET gate. In the formation of conventional FETs, this implant penetrates into but not through the gates. It also penetrates the silicon substrate adjacent to the gates (just beyond the spacer dielectric), forming self-aligned source and drain areas. Masks are used to block this source-drain implant from FETs of opposite type; that is, N implants are blocked from PFETs, and P implants from NFETs.

One feature of the present invention is the use of such masks to block the source-drain implant from the CCD gaps. This blocking is shown in FIG. 2A, and in more detail in FIG. 2B. The ion stream 20 which produces the source-drain implant is thus blocked by a mask 18 from the gaps 21, while still being permitted to penetrate the gates 16. As shown in FIG. 2B, this implant is also blocked from a narrow region 26 of each gate 16, in order to assure that the gaps are not implanted even in the event of imperfect alignment of mask 18. At the conclusion of the source-drain implant step, ions have been implanted within the polysilicon gates as shown by the shaded areas 22 in FIGS. 1 and 2B.

This same implanted dopant distribution is shown in FIG. 3A. Following the source-drain implant step, an annealing process (not shown in the drawings) activates the dopant atoms that have been implanted in the polysilicon gates 16. This annealing process induces the implanted dopant atoms to diffuse through the full extent of the gate 16, as shown in FIG. 3B. The density of shading in FIG. 3A schematically indicates the distribution of dopant atoms after implantation. FIG. 3B schematically indicates the spreading of the active dopant atoms more uniformly through the gate after annealing.

Most conventional CMOS processes provide a layer of metal silicide added to the gate and source/drain regions for increased conductivity. In order to form this silicide layer, a layer of metal is deposited on the wafer surface. After deposition of the metal, the wafer is annealed. During this annealing step, a layer of metal silicide is formed wherever the metal rests on silicon or polysilicon. Where the metal is not in contact with silicon, as for example where it rests on oxide, no silicide is formed. The metal which did not form silicide is removed in a subsequent step. A silicide-blocking mask is conventionally provided to protect certain areas of the chip from silicide formation, for example in order to create un-silicided polysilicon resistors.

Figure 4:
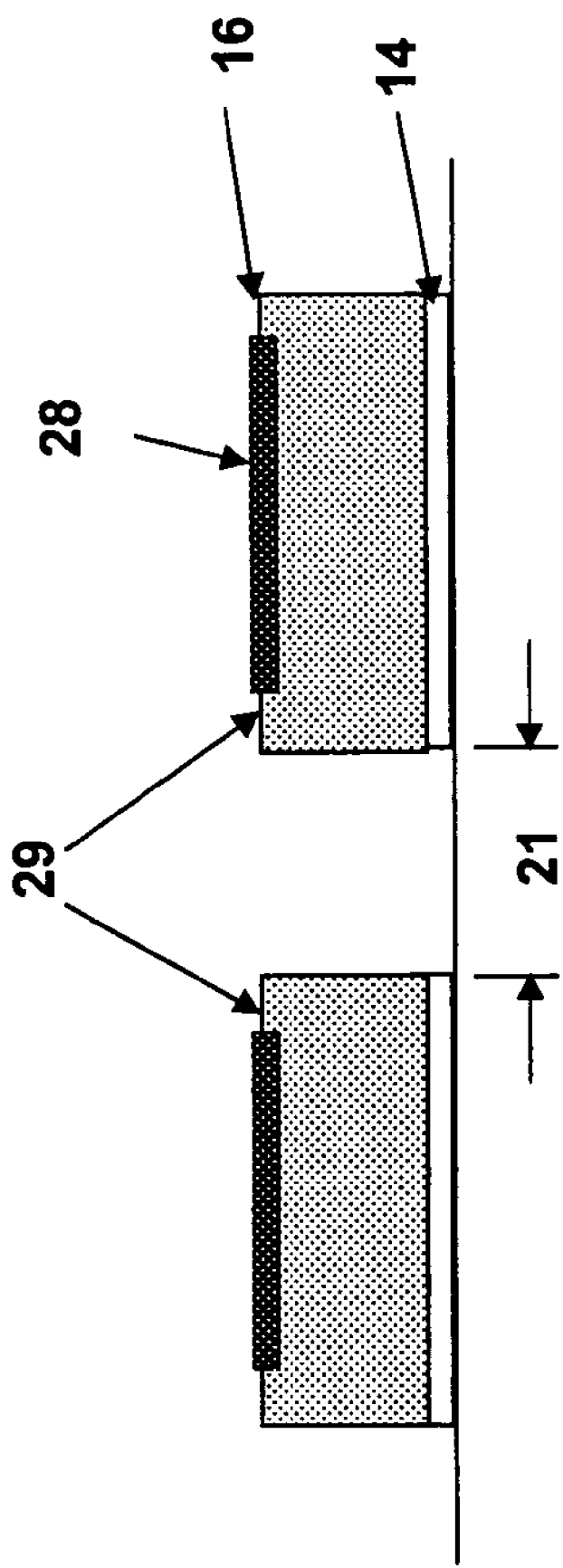
FIG. 4 shows CCD gates with patterned metal silicide.

It would be desirable, when forming a CCD in a CMOS process which provides for silicided gates, to take advantage of the increased gate conductivity in the CCD as well as in conventional FETs. In a CCD, however, any silicide in the gaps 21 would prevent proper operation. A feature of this invention is thus the use of a silicide-blocking mask to prevent formation of silicide in the CCD gaps 21. FIG. 4 illustrates a portion of a CCD in which silicide 28 is formed on a portion of gates 16 but not in the gap 21. By protecting a region 29 near each edge of the gate from silicide formation, silicide formation in the gap is prevented even in the event of imperfect alignment of the silicide-blocking mask. The silicide in the region 28 in the middle of the gate 16 still provides the benefit of improved gate conductivity.

Figure 5:
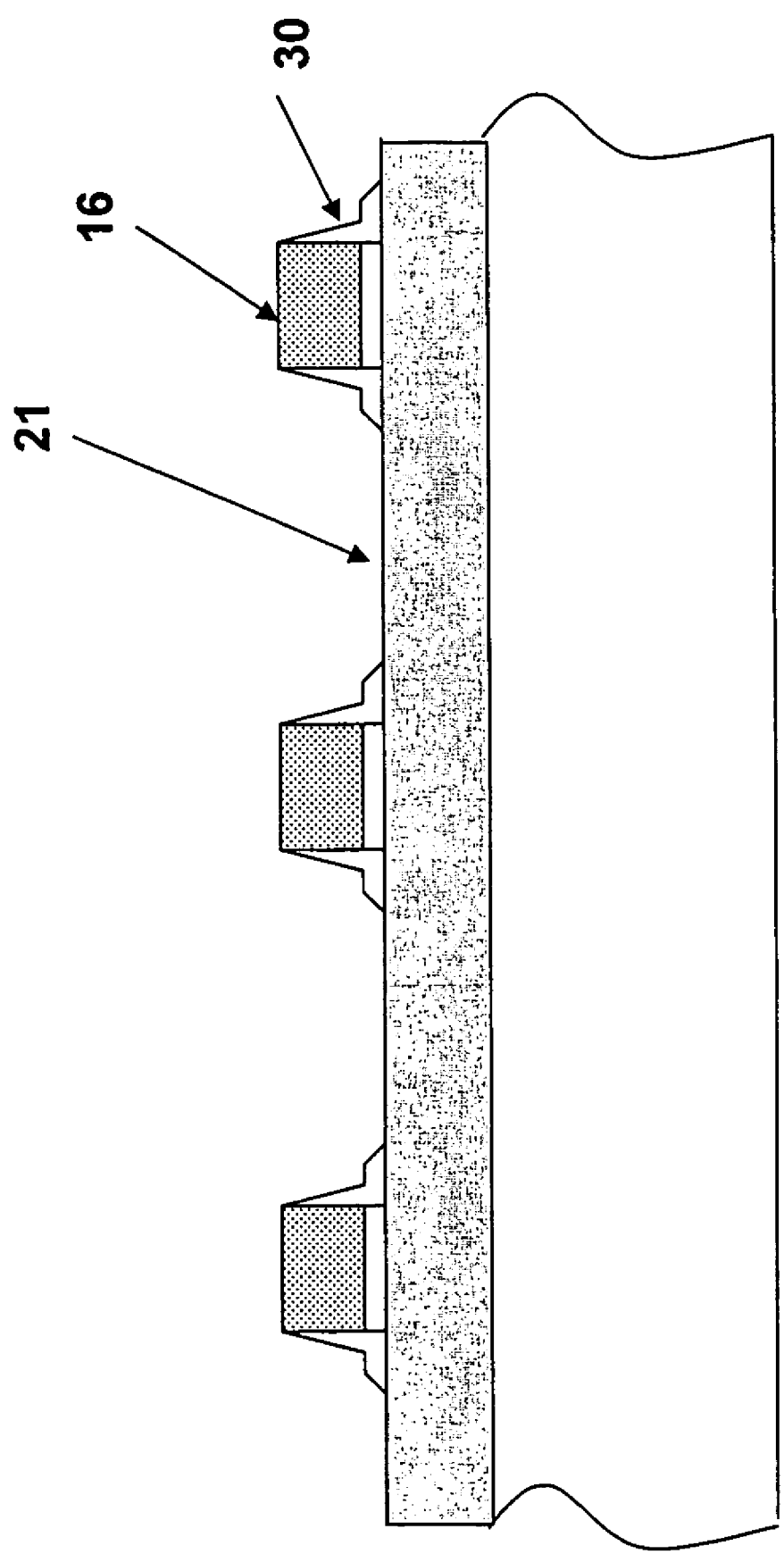
FIG. 5 shows the spacer-insulator layer after formation at the edges of CCD gates.

In conventional CMOS processes, an insulating spacer layer is formed on each side of every FET gate. This spacer is used both to define the source-drain extension regions adjacent to the FETs, and to prevent silicide formation on the sides of the gate and the immediately-adjacent silicon substrate. As shown in FIG. 5 when fabricating a CCD according to the present invention, this spacer 30 may partially or completely cover the gap 21 formed between adjacent gates 16 in the CCD device. In the example illustrated in FIG. 5, the gap is partially covered by spacer material. In FIG. 6A, the entire gap is shown covered by the merged spacers 30 from adjacent gates 16. Coverage of the silicon substrate in the gaps by the merged spacers 30 prevents silicide formation in the gap. As a result, silicide 31 forms only on the exposed polysilicon gates. The resulting structure is shown in FIG. 6B. If the process rules permit gate spacing (gaps) small enough to provide complete gap coverage by the spacer as shown in FIG. 6A, then this use of merged spacers 30 provides an alternative to the use of the silicide-blocking mask for forming functional CCDs with silicided gates according to the present invention.

Figure 7:
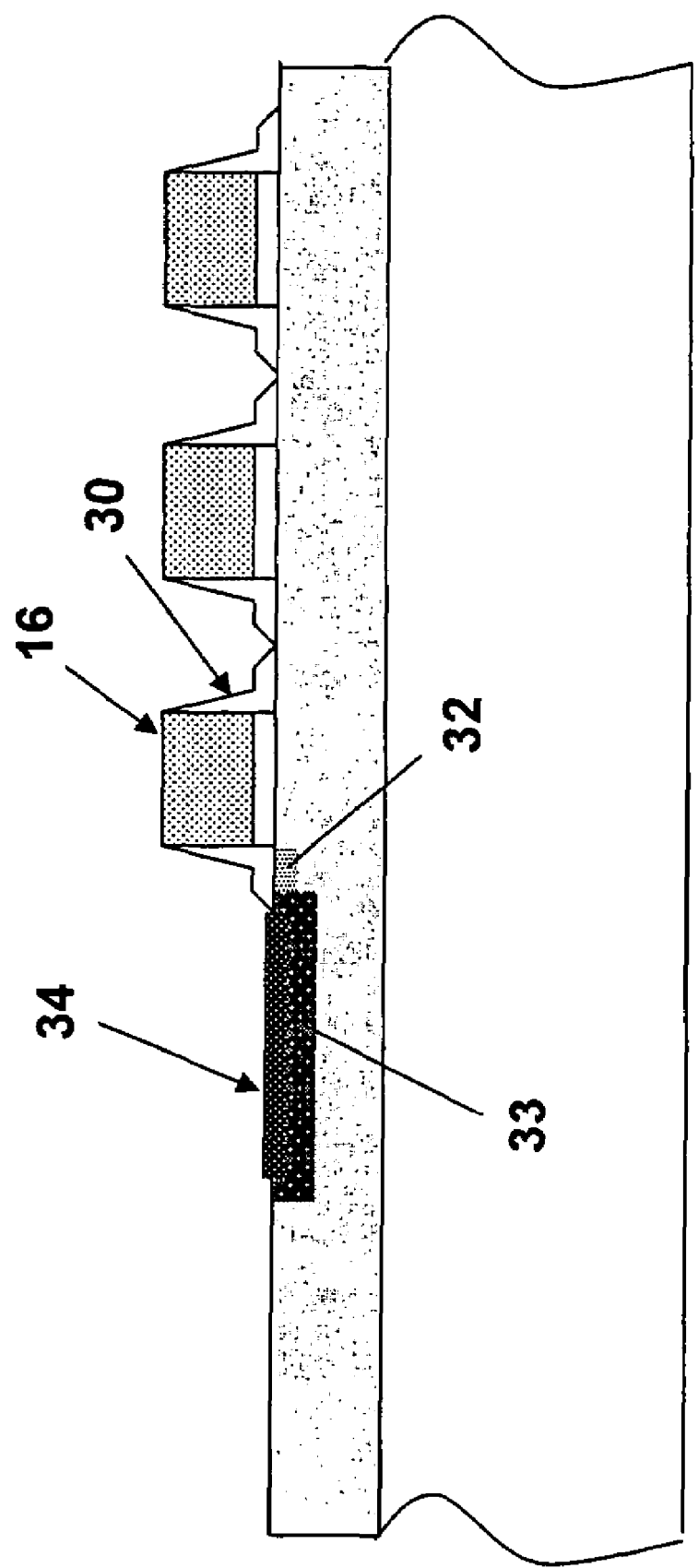
FIG. 7 illustrates auxiliary charge transfer structures using doped regions.

Most CCD circuits need a mechanism for introducing charge into the CCD and for removing charge from it. One method to accomplish both of these actions is to provide a region of doped semiconductor adjacent to a CCD gate. In a conventional CMOS process this feature is easily obtained by using the implants that form the source/drain region of transistors. FIG. 7 shows such a region at the end of a sequence of CCD gates. In this case implantation of the source-drain extension 32 is allowed next to the gate 16, and the other source-drain implants that are part of forming a transistor are allowed also, resulting in the doped formation 33 with a metal-silicide contact 34.

It can now be understood how both CCD and CMOS structures can be fabricated on the same substrate, using only the process steps commonly available in standard low cost CMOS fabrication processes.

While this invention has been particularly shown and described with references to preferred embodiments thereof, it will be understood by those skilled in the art that various changes in form and details may be made therein without departing from the scope of the invention encompassed by the appended claims.

What is claimed is:

1. A method of forming a Charge-Coupled Device (CCD) in a Complementary Metal Oxide Semiconductor (CMOS) process comprising:
    providing a substrate having a charge-carrying region;
    forming a gate oxide layer on the charge-carrying region;
    forming a plurality of single layer polysilicon gates on the gate oxide layer, by depositing a polysilicon layer on the gate oxide layer and then patterning the polysilicon layer to define the individual single layer polysilicon gates and a plurality of gaps therebetween;
    positioning a mask to define masked regions and unmasked regions substantially aligned with the gaps and the gates, respectively; and
    applying a dopant selectively into the unmasked regions associated with each of the plurality of single layer polysilicon gates, wherein the masked regions prevent penetration of the dopants into the gap regions.

2. The method of claim 1 additionally comprising:
    annealing the single layer polysilicon gates to further spread the dopant through the single layer polysilicon gates.

3. The method of claim 1 wherein the dopant is applied by ion implantation.

4. The method of claim 1 wherein the dopant is a P-type for one or more of the polysilicon gates.

5. The method of claim 1 wherein the dopant is an N-type for one or more of the polysilicon gates.

6. The method of claim 1 wherein at least one masked region extends over at least a portion of the edge of at least one of the gates.

7. The method of claim 1 wherein the mask is also used to define one or more N-or P-type field-effect transistors elsewhere on the substrate.

8. The method of claim 1 wherein a lightly doped as-grown substrate is used.

9. The method of claim 1 additionally comprising the step of
    positioning a mask to prevent penetration of the gaps by an additional implant that is part of the CMOS process.

10. The method of claim 9 wherein the implant is selected from the group consisting of a source-drain extension implant and a lightly-doped drain implant.

11. The method of claim 1 wherein the polysilicon gates are formed in a dopant atmosphere.

12. The method of claim 1 wherein a source/drain structure as used for forming MOS transistor structures is placed adjacent at least one gate for injection or extraction of charge.

13. The method of claim 1 additionally comprising the steps of:
    forming devices commonly used in Complementary Metal Oxide Semiconductor (CMOS) circuits including NFETs and PFETs using the same substrate, mask and dopant application steps used to form the CCD device.

14. The method of claim 1 additionally comprising the step of:
    forming a metal silicide region on at least one single-layer polysilicon gate.

15. The method of claim 14 wherein a mask used to pattern metal silicide further prevents silicide formation in at least one of the gaps.

16. The method of claim 14 wherein a mask used to pattern metal silicide is also used to define resistors elsewhere on the substrate by preventing the formation of silicide on polysilicon or on diffused regions.

17. The method of claim 14 wherein a mask used to pattern metal silicide further prevents silicide formation over at least a portion of the periphery of at least one of the gates.

18. The method of claim 1 wherein one or more gates are sufficiently close together such that a source-drain-extension spacer insulator fills the gaps between gates, and such that silicide may be formed on the gates but prevented from forming in the gaps.

19. A method of forming a Charge-Coupled Device (CCD) in a Complementary Metal Oxide Semiconductor (CMOS) process comprising:
    providing a substrate having a charge-carrying region;
    preserving an as-grown, native doping level of the substrate;
    forming a gate oxide layer on the charge-carrying region; and
    forming a plurality of single layer polysilicon gates on the gate oxide layer, by depositing a polysilicon layer on the gate oxide layer and then patterning the polysilicon layer to define the individual single layer polysilicon gates and a plurality of gaps therebetween further comprising:

positioning a mask to define masked regions and unmasked regions substantially aligned with the gaps and the gates, respectively; and applying a dopant selectively into the unmasked regions associated with each of the plurality of single layer polysilicon gates, wherein the masked regions prevent penetration of the implanting dopants into the gap regions.

20. The method of claim 19 additionally comprising:

annealing the single layer polysilicon gates to further spread the dopant through the single layer polysilicon gates.

21. The method of claim 19 wherein the dopant is applied by ion implantation.

22. The method of claim 19 wherein at least one masked region extends over at least a portion of the edge of at least one of the gates.

23. The method of claim 19 wherein the mask is also used to define one or more N-or P-type field-effect transistors elsewhere on the substrate.

24. The method of claim 19 additionally comprising the step of positioning an implantation mask to prevent penetration of the gaps by an implant step.

25. The method of claim 19 wherein the implant step is selected from the group consisting of a source-drain extension step and a lightly-doped drain implant step that are part of the CMOS process.

26. The method of claim 19 wherein the polysilicon gates are formed in a dopant atmosphere.

27. The method of claim 19 wherein a source/drain structure as used for forming CMOS transistor structures is placed adjacent at least one gate for injection or extraction of charge.

28. The method of claim 19 additionally comprising the step of:

forming one or more devices commonly used in Complementary Metal Oxide Semiconductor (CMOS) circuits using the same substrate, mask and dopant application steps used to form the CCD device.

29. A method of forming a Charge-Coupled Device (CCD) in a Complementary Metal Oxide Semiconductor (CMOS) process comprising:

providing a substrate having a charge-carrying region;

preserving an as-grown, native doping level of the substrate;

forming a gate oxide layer on the charge-carrying region;

forming a plurality of gates on the gate oxide layer, by depositing a layer of conductive material on the gate oxide layer and then patterning said conductive material layer to define the individual gates and a plurality of gaps therebetween; and preventing doping in said gaps during further processing by use of photomasking steps available in said CMOS process.

* * * * *